US011062922B2

United States Patent
Nagai et al.

(10) Patent No.: US 11,062,922 B2
(45) Date of Patent: Jul. 13, 2021

(54) SUBSTRATE LIQUID PROCESSING APPARATUS

(71) Applicant: Tokyo Electron Limited, Tokyo (JP)

(72) Inventors: Takashi Nagai, Koshi (JP); Hideaki Sato, Koshi (JP); Hiromi Hara, Koshi (JP); Hiroshi Yoshida, Koshi (JP); Tsukasa Hirayama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 540 days.

(21) Appl. No.: 15/905,941

(22) Filed: Feb. 27, 2018

(65) Prior Publication Data

US 2018/0247841 A1 Aug. 30, 2018

(30) Foreign Application Priority Data

Feb. 28, 2017 (JP) .............................. JP2017-037148
Jan. 19, 2018 (JP) .............................. JP2018-007476

(51) Int. Cl.
*H01L 21/67* (2006.01)
*G08B 21/18* (2006.01)

(52) U.S. Cl.
CPC ........ *H01L 21/67086* (2013.01); *G08B 21/18* (2013.01); *H01L 21/67248* (2013.01); *H01L 21/67253* (2013.01)

(58) Field of Classification Search
None
See application file for complete search history.

(56) References Cited

U.S. PATENT DOCUMENTS

| 5,353,369 A | * | 10/1994 | Scarpa | H01L 21/67086 |
| | | | | 126/376.1 |
| 2004/0140365 A1 | * | 7/2004 | Izuta | H01L 21/67248 |
| | | | | 237/12 |
| 2006/0157197 A1 | * | 7/2006 | Maegawa | H01L 21/67086 |
| | | | | 156/345.18 |
| 2008/0179293 A1 | * | 7/2008 | Wei | H01L 21/30604 |
| | | | | 216/84 |
| 2017/0358470 A1 | * | 12/2017 | Tanaka | H01L 21/67086 |
| 2018/0233384 A1 | * | 8/2018 | Nagai | H01L 21/67248 |

FOREIGN PATENT DOCUMENTS

JP  3939630 B2  4/2007

* cited by examiner

*Primary Examiner* — Keath T Chen
*Assistant Examiner* — Margaret D Klunk
(74) *Attorney, Agent, or Firm* — Pearne & Gordon LLP

(57) ABSTRACT

A substrate liquid processing apparatus includes a processing tub 34A which is configured to store therein a processing liquid in a boiling state and in which a processing of a substrate 8 is performed by immersing the substrate in the stored processing liquid; a concentration sensor 55B configured to detect a concentration of a chemical liquid component contained in the processing liquid; a concentration control unit 7 (40, 41) configured to control the concentration of the chemical liquid component to a set concentration by adding the chemical liquid component or a diluting solution to the processing liquid based on a detection concentration of the concentration sensor; a head pressure sensor 86B configured to detect a head pressure of the processing liquid within the processing tub; and a concentration set value correction unit 7 configured to correct, based on a detection value of the head pressure sensor, the set concentration.

12 Claims, 4 Drawing Sheets

SUBSTRATE LIQUID PROCESSING APPARATUS

CROSS-REFERENCE TO RELATED APPLICATION

This application claims the benefit of Japanese Patent Application Nos. 2017-037147 and 2018-007476 filed on Feb. 28, 2017 and Jan. 19, 2018, respectively, the entire disclosures of which are incorporated herein by reference.

TECHNICAL FIELD

The embodiments described herein pertain generally to a substrate liquid processing apparatus configured to perform a liquid processing on a substrate such as a semiconductor wafer by immersing the substrate in a processing liquid stored in a processing tub.

BACKGROUND

In a manufacturing process of a semiconductor device, to wet-etch a silicon nitride film formed on a surface of a substrate such as a semiconductor wafer, multiple substrates are immersed in heated phosphoric acid aqueous solution stored in a processing tub. To perform this wet-etching efficiently and appropriately, the phosphoric acid aqueous solution needs to be maintained in an appropriate boiling state.

Patent Document 1 describes a control method using a configuration of a bubbling type liquid level meter. In this control method, a boiling state of the phosphoric acid aqueous solution is estimated based on a detected head pressure (back pressure), and an output of a heater or a supply amount of pure water is controlled based on the estimated boiling state. Even with this control method, however, the boiling state cannot be controlled sufficiently stably.

Patent Document 1: Japanese Patent No. 3,939,630

SUMMARY

In view of the foregoing, exemplary embodiments provide a substrate liquid processing apparatus capable of controlling a boiling state of a processing liquid within a processing tub more accurately.

In one exemplary embodiment, a substrate liquid processing apparatus includes a processing tub which is configured to store therein a processing liquid in a boiling state and in which a processing of a substrate is performed by immersing the substrate in the stored processing liquid; a concentration sensor configured to detect a concentration of a chemical liquid component contained in the processing liquid; a concentration control unit configured to control the concentration of the chemical liquid component contained in the processing liquid to a set concentration by adding the chemical liquid component or a diluting solution to the processing liquid based on a detection concentration of the concentration sensor; a head pressure sensor configured to detect a head pressure of the processing liquid within the processing tub; and a concentration set value correction unit configured to correct, based on a detection value of the head pressure sensor, the set concentration assigned to the concentration control unit.

According to the exemplary embodiments, the boiling state of the processing liquid within the processing tub can be controlled more accurately to correct the set concentration assigned to the concentration control unit based on the detected boiling level.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
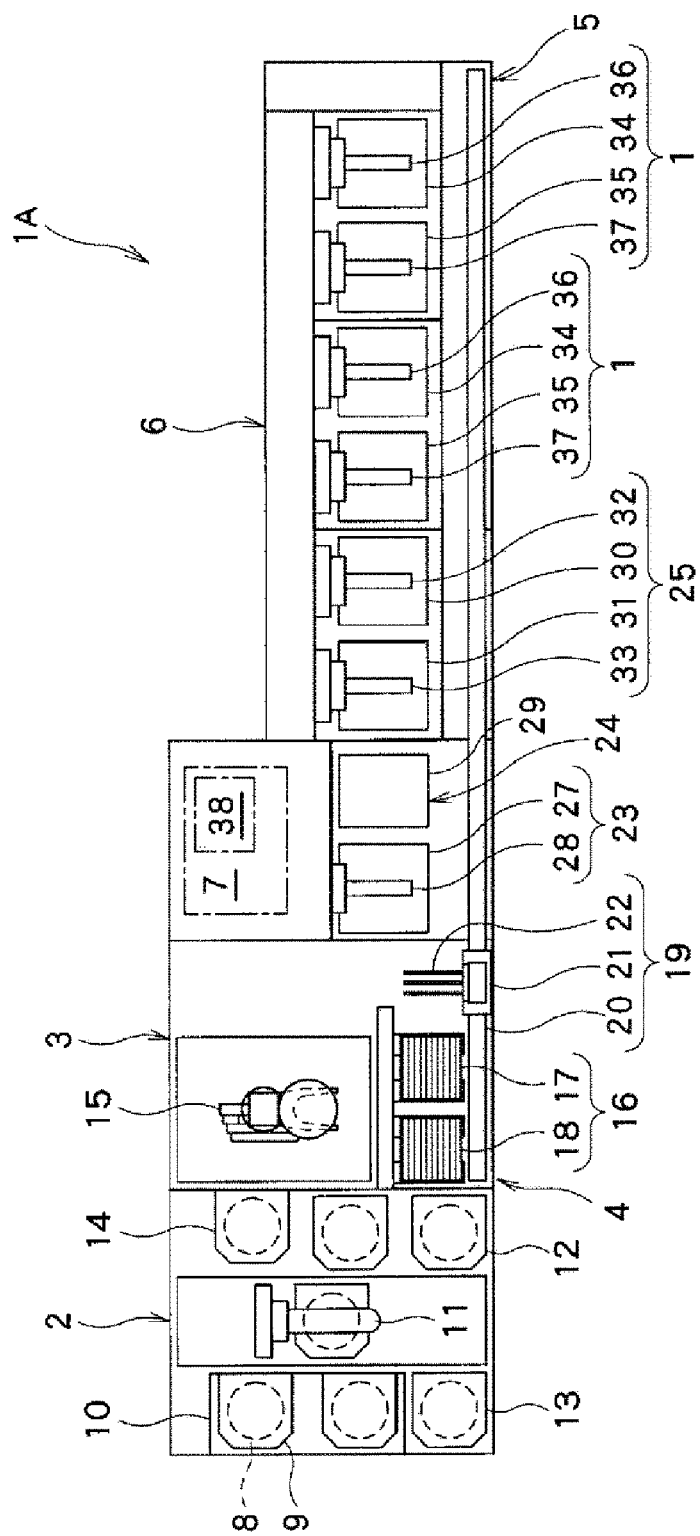
FIG. 1 is a schematic plan view illustrating an overall configuration of a substrate liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. First, an entire substrate liquid processing system 1A including a substrate liquid processing apparatus (etching apparatus) 1 embedded therein according to an exemplary embodiment will be described.

As illustrated in FIG. 1, the substrate liquid processing system 1A includes a carrier carry-in/out unit 2; a lot forming unit 3, a lot placing unit 4, a lot transferring unit 5, a lot processing unit 6 and a control unit 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily places therein a substrate 8 to become a product before being processed by the lot processing unit 6. Further, the carrier stock 13 temporarily places therein the substrate 8 to become a product after being processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9, which is placed on the carrier placing table 14, to the carrier stock 13 or the carrier stage 10 by using the carrier transfer device 11. The carrier 9 transferred to the carrier stage 10 is carried to the outside.

The lot forming unit 3 forms a lot composed of a multiple number (e.g., 50 sheets) of substrates 8 to be processed at the same time which are combined with substrates 8 accommodated in one or multiple carriers 9. Further, when forming the lot, the substrates 8 may be arranged such that surfaces thereof having patterns formed thereon face each other or such that the surfaces thereof having the patterns formed thereon all face to one direction.

The lot forming unit 3 is equipped with a substrate transfer device 15 configured to transfer a plurality of substrates 8. Further, the substrate transfer device 15 is capable of changing a posture of the substrates 8 from a horizontal posture to a vertical posture and from the vertical posture to the horizontal posture while transferring the substrates 8.

In the lot forming unit 3, the substrates 8 are transferred into the lot placing unit 4 from the carrier 9 placed on the carrier placing table 14 by using the substrate transfer device 15, and the substrates 8 forming the lot are placed in the lot placing unit 4. Further, in the lot forming unit 3, the lot placed in the lot placing unit 4 is transferred into the carrier 9 placed on the carrier placing table 14 by the substrate transfer device 15. Further, the substrate transfer device 15 is equipped with, as a substrate supporting unit configured to support the multiple number of substrates 8, two types of substrate supporting unit, that is, a before-processed substrate supporting unit configured to support the substrates 8 before being subjected to a processing (that is, before being transferred by the lot transferring unit 5); and an after-processed substrate supporting unit configured to support the processed substrates 8 (after being transferred by the lot transferring unit 5). Accordingly, particles or the like adhering to the substrates 8 before being processed may be suppressed from adhering to the substrates 8 after being processed.

In the lot placing unit 4, the lot transferred between the lot forming unit 3 and the lot processing unit 6 by the lot transferring unit 5 is temporarily placed (stands by) on the lot placing table 16.

The lot placing unit 4 is equipped with a carry-in side lot placing table 17 configured to place thereon the lot before being processed (before being transferred by the lot transferring unit 5); and a carry-out side lot placing table 18 configured to place thereon the lot after being processed (after being transferred by the lot transferring unit 5). On each of the carry-in side lot placing table 17 and the carry-out side lot placing table 18, the multiple number of substrates 8 corresponding to the single lot are arranged in a forward-backward direction with the vertical posture.

In the lot placing unit 4, the lot formed in the lot forming unit 3 is placed on the carry-in side lot placing table 17, and this lot is carried into the lot processing unit 6 through the lot transferring unit 5. Further, in the lot placing unit 4, the lot carried out of the lot processing unit 6 through the lot transferring unit 5 is placed on the carry-out side lot placing table 18, and this lot is transferred into the lot forming unit 3.

The lot transferring unit 5 is configured to transfer the lot between the lot placing unit 4 and the lot processing unit 6 and within the lot processing unit 6.

The lot transferring unit 5 is equipped with the lot transfer device 19 configured to transfer the lot.

The lot transfer device 19 includes a rail 20 extended along the lot placing unit 4 and the lot processing unit 6; and a moving body 21 configured to be moved along the rail 20 while holding the multiple number of substrates 8. The moving body 21 is provided with a substrate holding body 22 for holding the multiple number of substrates 8 arranged in the forward-backward direction with the vertical posture, and the substrate holding body 22 is configured to be movable forward and backward.

The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18. Further, the lot transferring unit 5 also performs the transfer of the lot within the lot processing unit 6 by using the lot transfer device 19.

The lot processing unit 6 is configured to perform a processing such as etching, cleaning and drying on the single lot composed of the substrates 8 arranged in the forward-backward direction with the vertical posture.

The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 25 configured to perform a cleaning processing on the substrates 8; and two etching apparatuses (substrate liquid processing apparatuses) 1 according to the exemplary embodiment, each of which is configured to perform an etching processing on the substrates 8.

The drying apparatus 23 is equipped with a processing tub 27; and a substrate elevating device 28 provided at the processing tub 27 and configured to be moved up and down. A processing gas for drying (IPA (isopropyl alcohol) or the like) is supplied into the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 with the substrate elevating device 28, and moves the received lot up and down with the substrate elevating device 28, so that a drying processing of the substrates 8 is performed with the processing gas for drying supplied into the processing tub 27. Further, the drying apparatus 23 delivers the lot to the substrate holding body 22 of the lot transfer device 19 from the substrate elevating device 28.

The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, a cleaning processing on the substrate holding body 22 is performed.

The cleaning apparatus 25 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like).

The etching apparatus 1 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like).

The cleaning apparatus 25 and the etching apparatus 1 have the same configuration. The etching apparatus (substrate liquid processing apparatus) 1 will be described. The multiple number of substrates 8 constituting the single lot are held by the substrate elevating device 36 while being arranged in the forward-backward direction with the vertical posture. In the etching apparatus 1, the substrate elevating device 36 receives the lot from the substrate holding body 22 of the lot transfer device 19, and the received lot is moved up and down by the substrate elevating device 36. Accordingly, the lot is immersed in the processing liquid for etching in the processing tub 34, so that an etching processing is performed on the substrates 8. Thereafter, the etching apparatus 1 delivers the lot to the substrate holding body 22 of the lot transfer device 19 from the substrate elevating device 36. Then, the lot is received by the substrate elevating device 37 from the substrate holding body 22 of the lot transfer device 19, and the received lot is moved up and down by the substrate elevating device 37. Accordingly, the lot is immersed in the processing liquid for rinsing in the processing tub 35, so that a rinsing processing is performed on the substrates 8. Thereafter, the lot is delivered to the substrate holding body 22 of the lot transfer device 19 from the substrate elevating device 37.

The control unit 7 controls operations of individual components (the carrier carry-in/out unit 2, the lot forming unit 3, the lot placing unit 4, the lot transferring unit 5, the lot processing unit 6 and the etching apparatus 1) of the substrate liquid processing system 1A.

The control unit 7 may be implemented by, for example, a computer and has a computer-readable recording medium 38. The recording medium 38 stores therein programs for controlling various types of processings performed in the substrate liquid processing apparatus 1. The control unit 7 controls the operation of the substrate liquid processing apparatus 1 by reading and executing the programs stored in the recording medium 38. Further, the programs are stored in the compute-readable recording medium 38 and may be installed to the recording medium 38 of the control unit 7 from another recording medium.

The computer-readable recording medium 38 may be implemented by, by way of example, a hard disk HD, a flexible disk FD, a compact disk CD, a magnet optical disk MO, a memory card, or the like.

As stated above, in the processing tub 34 of the etching apparatus 1, the substrate 8 is liquid-processed (etched) by using an aqueous solution (phosphoric acid aqueous solution) of a chemical (phosphoric acid) having a preset concentration as the processing liquid (etching liquid).

Figure 2:
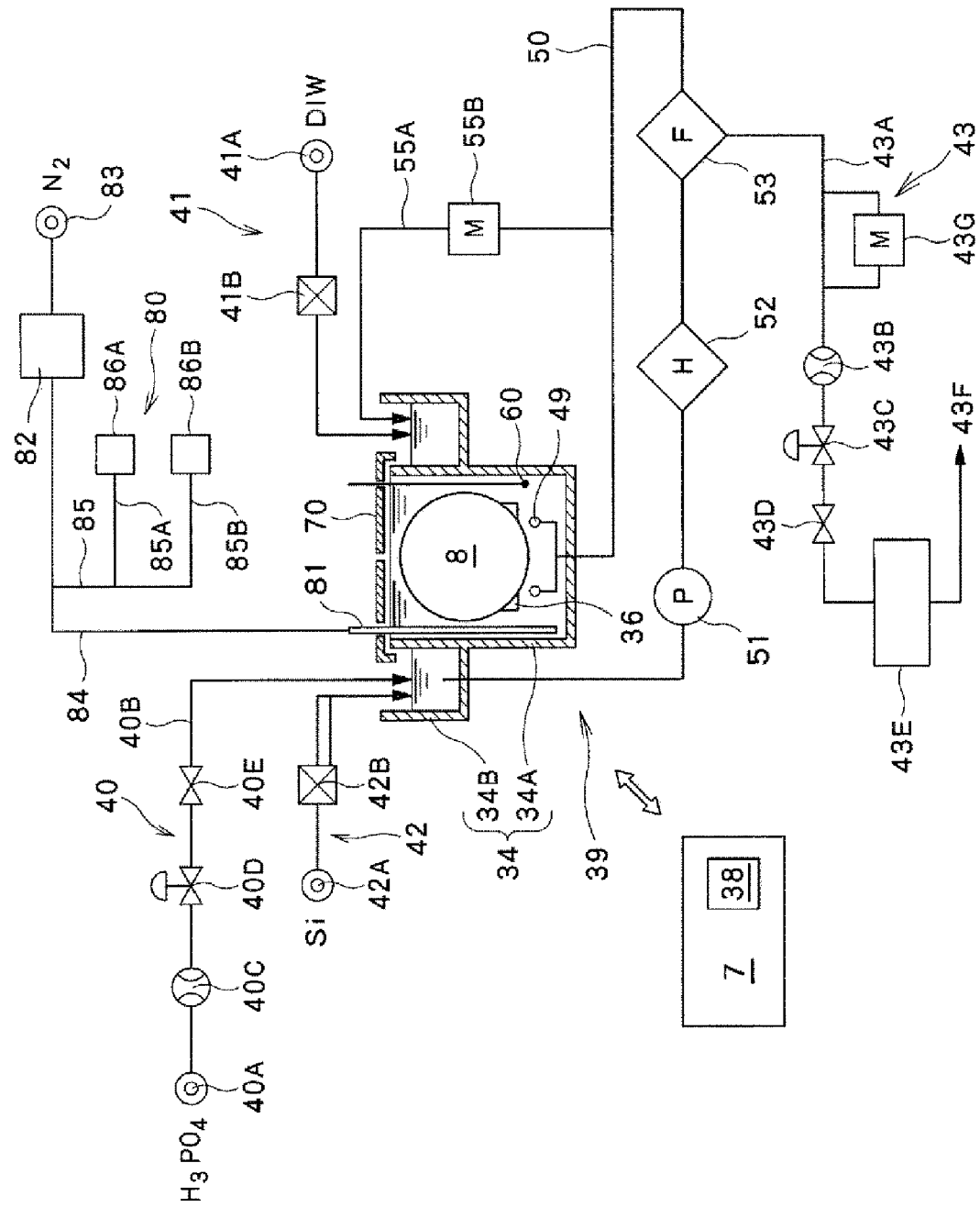
FIG. 2 is a block diagram illustrating a configuration of an etching apparatus provided in the substrate liquid processing system.

Now, a configuration regarding the etching apparatus (substrate liquid processing apparatus) 1, particularly, the processing tub 34 for etching will be explained with reference to FIG. 2.

The etching apparatus 1 has the aforementioned processing tub 34 storing therein the phosphoric acid aqueous solution having the preset concentration as the processing liquid. The processing tub 34 includes an inner tub 34A having an open top; and an outer tub 34B which is provided around the inner tub 34A and has an open top. The phosphoric acid aqueous solution overflowing from the inner tub 34A is introduced into the outer tub 34B. The outer tub 34B surrounds an upper portion of the inner tub 34A, as illustrated in FIG. 2. The outer tub 34B may be configured to accommodate the inner tub 34A therein. The processing tub 34 is provided with a cover 70 for keeping a temperature of the phosphoric acid aqueous solution and suppressing scattering of a splash of the phosphoric acid aqueous solution. This cover 70 is configured to be opened/closed and cover at least an upper opening of the inner tub 34A.

One end of a circulation line 50 is connected to a bottom portion of the outer tub 34B. The other end of the circulation line 50 is connected to a processing liquid supply nozzle 49 provided within the inner tub 34A. The circulation line 50 is provided with a pump 51, a heater 52 and a filter 53 in sequence from the upstream side.

By operating the pump 51, there is generated a circulation flow of the phosphoric acid aqueous solution which is sent from the outer tub 34B into the inner tub 34A via the circulation line 50 and the processing liquid supply nozzle 49 and then flown back into the outer tub 34B. A gas nozzle (not shown) may be provided under the processing liquid supply nozzle 49 within the inner tub 34A, and bubbling of an inert gas such as, but not limited to, a nitrogen gas may be performed to stabilize the boiling state of the phosphoric acid aqueous solution.

The processing tub 34, the circulation line 50, the devices 51, 52 and 53 within the circulation line 50, and so forth constitute a liquid processing unit 39. Further, the processing tub 34 and the circulation line 50 constitute a circulation system.

The etching apparatus 1 includes a phosphoric acid aqueous solution supply unit 40 configured to supply the phosphoric acid aqueous solution to the liquid processing unit 39; a pure water supply unit 41 configured to supply pure water to the liquid processing unit 39; a silicon supply unit 42 configured to supply a silicon solution to the liquid processing unit 39; and a phosphoric acid aqueous solution drain unit 43 configured to drain the phosphoric acid aqueous solution from the liquid processing unit 39.

The phosphoric acid aqueous solution supply unit 40 is configured to supply the phosphoric acid aqueous solution having the preset concentration into a certain portion, desirably, the outer tub 34B as illustrated in the drawing, within the circulation system composed of the processing tub 34 and the circulation line 50, that is, within the liquid processing unit 39. The phosphoric acid aqueous solution supply unit 40 includes a phosphoric acid aqueous solution supply source 40A implemented by a tank storing therein the phosphoric acid aqueous solution; a phosphoric acid aqueous solution supply line 40B connecting the phosphoric acid aqueous solution supply source 40A and the outer tub 34B; a flowmeter 40C, a flow rate control valve 40D and an opening/closing valve 40E provided at the phosphoric acid aqueous solution supply line 40B in sequence from the upstream side thereof. The phosphoric acid aqueous solution supply unit 40 is capable of supplying the phosphoric acid aqueous solution into the outer tub 34B at a controlled flow rate through the flowmeter 40C and the flow rate control valve 40D.

The pure water supply unit 41 is configured to supply the pure water to supplement moisture evaporated as the phosphoric acid aqueous solution is heated. The pure water supply unit 41 includes a pure water supply source 41A configured to supply the pure water of a preset temperature. The pure water supply source 41A is connected to the outer tub 34B via a flow rate controller 41B.

The flow rate controller 41B may be implemented by an opening/closing valve, a flow rate control valve, a flowmeter, and the like.

The silicon supply unit 42 includes a silicon supply source 42A implemented by a tank storing therein the silicon solution, e.g., a liquid in which colloidal silicon is dispersed; and a flow rate controller 42B. The flow rate controller 42B may be implemented by an opening/closing valve, a flow rate control valve, a flowmeter, and the like.

The phosphoric acid aqueous solution drain unit 43 is configured to drain the phosphoric acid aqueous solution within the circulation system composed of the processing tub 34 and the circulation line 50, that is, within the liquid processing unit 39. The phosphoric acid aqueous solution drain unit 43 includes a drain line 43A branched from the circulation line 50; and a flowmeter 43B, a flow rate control valve 43C, an opening/closing valve 43D and a cooling tank 43E provided at the drain line 43A in sequence from the upstream side thereof. The phosphoric acid aqueous solution drain unit 43 is capable of draining the phosphoric acid aqueous solution at a controlled flow rate through the flowmeter 43B and the flow rate control valve 43C.

The cooling tank 43E temporarily stores therein the phosphoric acid aqueous solution flown through the drain line 43A while cooling the phosphoric acid aqueous solution. The phosphoric acid aqueous solution (see a reference numeral 43F) flown out from the cooling tank 43E may be wasted into a factory waste liquid system (not shown) or may be reused by being sent to the phosphoric acid aqueous solution supply source 40A after silicon contained in the phosphoric acid aqueous solution is removed by a recycling apparatus (not shown).

In the shown example, the drain line 43A is connected to the circulation line 50 (a position of a filter drain in the drawing). However, without being limited thereto, the drain line 43A may be connected to another portion within the circulation system, for example, a bottom portion of the inner tub 34A.

The drain line 43A is equipped with a silicon concentration meter 43G configured to measure a silicon concentration in the phosphoric acid aqueous solution. Further, a branch line 55A (this branch line 55A may be regarded as a part of the circulation system), which is branched from the circulation line 50 and connected to the outer tub 34B, is provided with a phosphoric acid concentration meter 55B configured to measure a phosphoric acid concentration in the phosphoric acid aqueous solution. The outer tub 34B is provided with a liquid level meter 44 configured to detect a liquid level within the outer tub 34B.

Within the inner tub 34A, there is provided a temperature sensor 60 configured to detect a temperature of the phosphoric acid aqueous solution within the inner tub 34A. The temperature sensor 60 may be provided at a position other than the inner tub 34A within the circulation system, for example, in the vicinity of an outlet of the heater 52 of the circulation line 50.

The inner tub 34A is additionally provided with a bubbling type liquid level meter 80. The bubbling type liquid level meter 80 includes a bubbling line 81 inserted into the phosphoric acid aqueous solution within the inner tub 34A; and a purge set 82 configured to supply a purge gas (here, a nitrogen gas) into the bubbling line 81. The bubbling line 81 may be made of a material having resistance against the phosphoric acid aqueous solution, e.g., quartz.

The purge set 82 includes a reducing valve, a throttle, a rotameter (all of these are not shown), and so forth. The purge set 82 is configured to perform a control of allowing the purge gas supplied from a pressurized gas supply source 83 (e.g., a factory power supply system) to be discharged at a constant flow rate from a tip end of the bubbling line 81 inserted in the phosphoric acid aqueous solution.

A gas line 84 connecting the bubbling line 81 and the purge set 82 is connected to a detection line 85, and this detection line 85 is branched into two branch detection lines: a first branch detection line 85A and a second branch detection line 85B. The first branch detection line 85A and the second branch detection line 85B are connected to a first detector 86A and a second detector 86B, respectively. The first and second detectors 86A and 86B are configured to measure a back pressure of the purge gas corresponding to a head pressure applied to the tip end of the bubbling line 81 (i.e., the head pressure of the phosphoric acid aqueous solution within the inner tub 34A).

Since the purge gas always flows in the gas line 84, the gas line 84, the detection line 85, the first branch detection line 85A and the second branch detection line 85B need not be made of quartz but may be made of an appropriate corrosion-resistant resin such as, but not limited to, PTFE or PFA.

The same pressure is applied to the first detector 86A and the second detector 86B. However, detection ranges of the first detector 86A and the second detector 86B are different.

The first detector 86A is capable of detecting a pressure within a range from the head pressure applied to the tip end of the bubbling line 81 when the liquid level of the phosphoric acid aqueous solution within the inner tub 34A is the lowest level (that is, when the inner tub 34A is empty) to the head pressure applied to the tip end of the bubbling line 81 when the liquid level of the phosphoric acid aqueous solution within the inner tub 34A is the highest level (that is, when the phosphoric acid aqueous solution is overflowing from the inner tub 34A into the outer tub 34B). That is, the first detector 86A is provided to measure the liquid level of the phosphoric acid aqueous solution within the inner tub 34A.

The second detector 86B is capable of detecting, at the time when the liquid level of the phosphoric acid aqueous solution within the inner tub 34A is the highest level (that is, when the phosphoric acid aqueous solution is overflowing from the inner tub 34A into the outer tub 34B), a pressure within a range (detection target range) from the head pressure applied to the tip end of the bubbling line 81 when the boiling level of the phosphoric acid aqueous solution is maximum to the head pressure applied to the tip end of the bubbling line 81 when the phosphoric acid aqueous solution is not boiled at all.

If the boiling level (boiling state) is changed, the amount of air bubbles in the phosphoric acid aqueous solution is changed, so that the head pressure applied to the tip end of the bubbling line 81 is also changed. That is, if the boiling level is increased, the head pressure is decreased, whereas if the boiling level is decreased, the head pressure is increased. The boiling level can be quantified (for example, in five levels of the boiling levels 1 to 5) by observing sizes and numbers of the air bubbles in the phosphoric acid aqueous solution and a liquid surface state ("even", "highly waving", and so froth) of the phosphoric acid aqueous solution with naked eyes or through an image analysis. By experiments, a relationship between the head pressure HP and the boiling level BL can be investigated, and this relationship can be expressed in the form of a function (BL=f(HP)). Although there is a slight difference, the head pressure HP decreases monotonically as the boiling level BL is increased.

The aforementioned function may be stored in the recording medium 38 of the control unit 7, for example. Accordingly, the boiling level (boiling state) of the phosphoric acid aqueous solution within the inner tub 34A can be investigated based on the head pressure detected by the second detector 86B. That is, the bubbling type liquid level meter 80 serves as a boiling level sensor.

Desirably, the second detector 86B is configured to be insensitive to a pressure out of the aforementioned detection target range but to improve the detection resolution for a pressure within the detection target range by an electric circuit (having a high pass filter function and an amplification function, for example) configured to process a sensor output of the second detector 86B or by an operation processing with software. Accordingly, though the second detector 86B cannot substantially detect the liquid level of the phosphoric acid aqueous solution within the inner tub 34A, the second detector 86B is capable of detecting the boiling state with higher accuracy instead.

To elaborate, assume that an output voltage (which is varied depending on a variation of the head pressure) of a pressure sensor (not shown) within the second detector 86B is 5V at a time when the phosphoric acid aqueous solution is not boiled at all, and the output voltage of the second detector 86B is 4V at a time when the boiling level of the phosphoric acid aqueous solution is the highest level. In this case, a detection circuit provided in the second detector 86B is configured to output a value obtained by multiplying a value, which is calculated by subtracting 4V from the output voltage of the pressure sensor (practically, an appropriate margin is set), by a preset gain (constant).

The substrate liquid processing apparatus 1 processes the substrates 8 by controlling the operations of the individual components (the carrier carry-in/out unit 2, the lot forming unit 3, the lot placing unit 4, the lot transferring unit 5, the lot processing unit 6 and the etching apparatus 1) under the control of the control unit 7 according to process recipes stored in the recording medium 38. Operational components (the opening/closing valves, the flow rate control valves, the pumps, the heaters, and so forth) of the etching apparatus 1 are operated based on operation instruction signals sent from the control unit 7. Further, signals indicating detection results are sent to the control unit 7 from the sensors 43G, 55B, 86A and 86B, and the control unit 7 uses the detection results to control the operational components.

Now, an operation of the above-described etching apparatus 1 will be discussed. First, the phosphoric acid aqueous solution supply unit 40 supplies the phosphoric acid aqueous solution into the outer tub 34B of the liquid processing unit 39. If a preset time elapses after the supply of the phosphoric acid aqueous solution is begun, the pump 51 of the circulation line 50 is operated, so that the circulation flow circulating in the aforementioned circulation system is generated.

Further, the heater 52 of the circulation line 50 is operated to heat the phosphoric acid aqueous solution such that the phosphoric acid aqueous solution within the inner tub 34A reaches a preset temperature (e.g., 160° C.). The cover 70 is closed, at the latest, by the time when the heating by the heater 52 is begun, and at least the top opening of the inner tub 34A is closed by the cover 70. The phosphoric acid aqueous solution of 160° C. is turned into a boiling state.

Before the substrates 8 corresponding to the single lot are put in the phosphoric acid aqueous solution within the inner tub 34A, the silicon concentration (which affects an etching selectivity of a silicon nitride film with respect to a silicon oxide film) in the phosphoric acid aqueous solution within the circulation system (including the inner tub 34A, the outer tub 34B and the circulation line 50) is adjusted. The adjustment of the silicon concentration may be performed by immersing a dummy substrate in the phosphoric acid aqueous solution within the inner tub 34A or by supplying the silicon solution into the outer tub 34B from the silicon supply unit 42. To check whether the silicon concentration in the phosphoric acid aqueous solution within the circulation system is within a predetermined range, the phosphoric acid aqueous solution may be flown to the drain line 43A and the silicon concentration may be measured by the silicon concentration meter 43G.

After the adjustment of the silicon concentration is finished, the cover 70 is opened, and the multiple number of substrates 8 held by the substrate elevating device 36, that is, the multiple number (e.g., 50 sheets) of substrates 8 corresponding to the single lot (also called as a processing lot or a batch) are immersed in the phosphoric acid aqueous solution within the inner tub 34A. Thereafter, the cover 70 is immediately closed. By immersing the substrates 8 in the phosphoric acid aqueous solution for a preset time period, a wet etching processing (liquid processing) is performed on the substrates 8.

While the wet etching processing is being performed on the substrates 8, the following controls are performed by the control unit 7.

[Temperature Control]

The control unit 7 feedback-controls an output of the heater 52 such that the temperature of the phosphoric acid aqueous solution within the inner tub 34A detected by the temperature sensor 60 reaches a set temperature. In this feedback control, the set temperature is a set value SV; the detection temperature of the temperature sensor 60, a measurement value PV; and the output of the heater 52, a manipulation amount MV. The control unit 7 and the heater 52 constitute a temperature control unit.

Further, in the present exemplary embodiment, the set temperature of the phosphoric acid aqueous solution is not changed according to a change in a concentration of the phosphoric acid or a change in a set concentration of the phosphoric acid, but maintained at a preset value which is set in the process recipes.

[Concentration Control]

The control unit 7 feedback-controls, when necessary, a supply amount of the pure water (diluting liquid) into the circulation system (in the shown example, the outer tub 34B) from the pure water supply unit 41 or a supply amount of the phosphoric acid into the circulation system (in the shown example, the outer tub 34B) from the phosphoric acid aqueous solution supply unit 40 such that the concentration of the phosphoric acid (chemical liquid component) in the phosphoric acid aqueous solution (processing liquid) within the circulation system detected by the phosphoric acid concentration meter 55B (concentration sensor) reaches the set concentration. In this feedback control, the set concentration is a set valve SV; the detection concentration of the phosphoric acid concentration meter 55B, a measurement value PV; the supply amount of the pure water (diluting liquid) into the circulation system (in the shown example, the outer tub 34B) from the pure water supply unit 41 or the supply amount of the phosphoric acid into the circulation system (in the shown example, the outer tub 34B) from the phosphoric acid aqueous solution supply unit 40, a manipulation amount MV. The control unit 7, the pure water supply unit 41 and the phosphoric acid aqueous solution supply unit 40 constitute a concentration control unit. Though a value previously set in the process recipes is used as an initial value of the set concentration, the set concentration is corrected through a boiling level control to be described later.

In the present exemplary embodiment, since the phosphoric acid aqueous solution is used as the processing liquid and this phosphoric acid aqueous solution is always boiling during the processing of the substrate 8, a content ratio of the pure water in the phosphoric acid aqueous solution always tends to be decreased and the concentration of the phosphoric acid always tends to be increased. Thus, it is only the pure water that is supplied into the circulation system for the concentration control.

[Boiling Level Control]

An initial value of the set concentration of the phosphoric acid (chemical liquid component) in the phosphoric acid aqueous solution (processing liquid) is set in the process recipes. At a time when starting this boiling level control, the above-described concentration control is performed based on the initial value of the set concentration.

The control unit 7 corrects the set concentration when the boiling level of the phosphoric acid aqueous solution within the inner tub 34A estimated based on the head pressure detected by the second detector 86B is deviated or is likely to be deviated from an optimum level (for example, the boiling level 4). By way of example, the set concentration is reduced when the boiling level becomes lower than the optimum level (for example, in a state where the amount of the air bubbles in the phosphoric acid aqueous solution is little and/or the size thereof is small) or is likely to become lower than the optimum level. Meanwhile, the set concentration is increased when the boiling level becomes higher than the optimum level (for example, in a state where the surface of the phosphoric acid aqueous solution is highly waving) or is likely to become higher than the optimum level.

Since it is not desirable that the boiling level is deviated from the optimum level, it is desirable to perform a control of correcting the set concentration to offset the change of the head pressure at the moment when the corresponding change of the head pressure which might predict the deviation of the boiling level from the optimum level is detected.

By way of example, it is assumed that a median value of an output voltage of the sensor of the second detector 86B is 4 V at the optimum boiling level (e.g., the boiling level 4), and the optimum boiling level can be obtained when the output voltage of the sensor of the second detector 86B is 4 V±0.2 V. At this time, assume that the output voltage of the sensor of the second detector 86B is increased from 4 V to 4.1 V. Even if the optimum boiling level is maintained regardless of this change of the output voltage, it is desirable to perform the control of correcting the set concentration such that the output voltage is suppressed to be increased to 4.2 V or more by changing the set concentration in a small amount. As an example, an initial value of the concentration set value is about 88%, and the concentration set value can be corrected at a pitch of 0.02 wt %.

Desirably, to suppress a hunting of the boiling level, the control unit 7 may perform the control while allowing the control to have hysteresis (dead band of the control). Further, since an effect of a concentration variation width upon the boiling level is different between two cases where the boiling level is higher than the optimum level and where the boiling level is lower than the optimum level, the variation widths need to be corrected with the corresponding optimum values. The optimum value of the variation width is determined based on the temperature, the concentration and the boiling state of the chemical liquid used in the process recipes and becomes a unique value set for each process recipe.

In the present exemplary embodiment, only the set concentration is corrected based on the detected boiling level, and the set temperature is not corrected. The actual temperature of the phosphoric acid aqueous solution can be controlled within a range of, e.g., the set temperature ±0.1° C.~0.2° C. with high accuracy by the above-stated temperature control.

Figure 3:
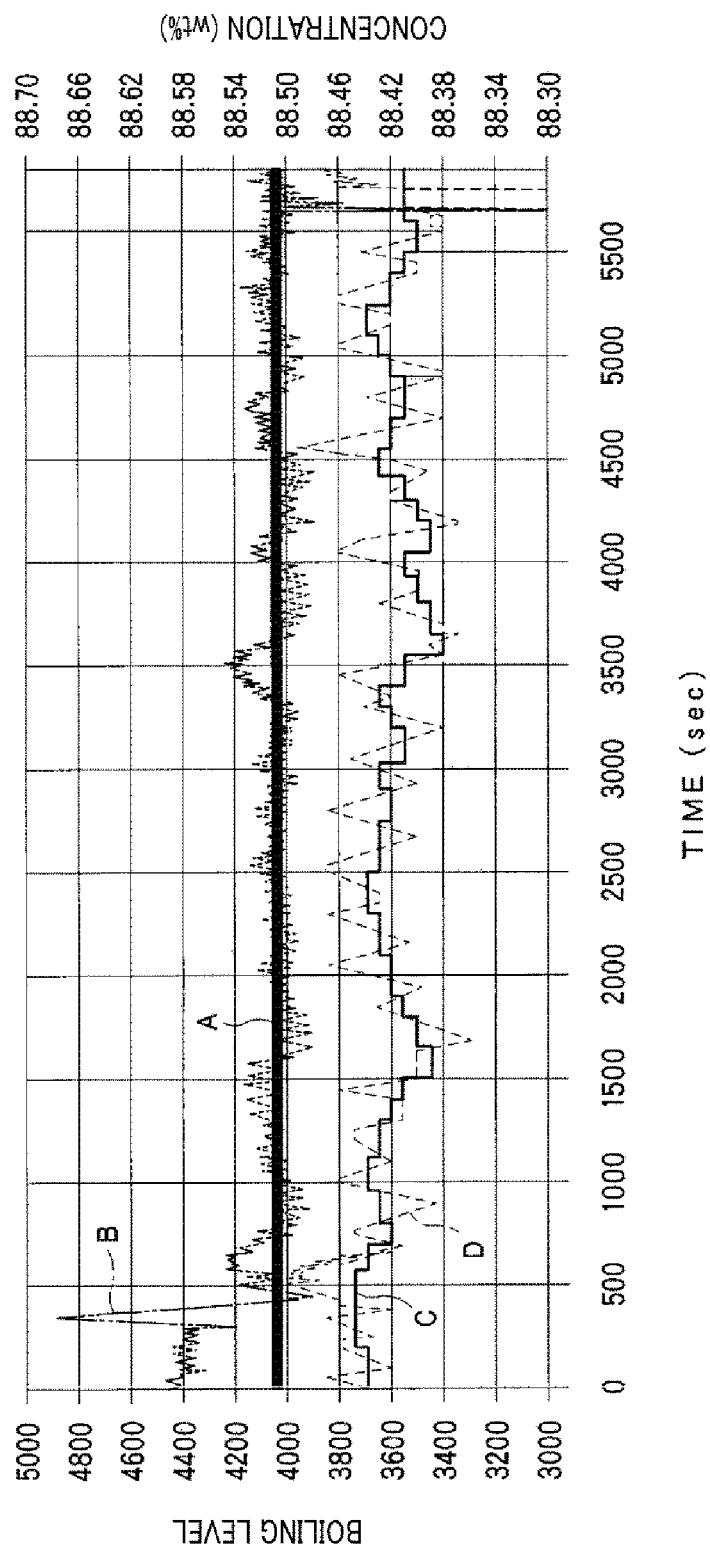
FIG. 3 is a graph showing an example of changes of a set value and an actual value of a boiling level and a set value (corrected set value) and an actual value of a concentration with a lapse of time when performing a test operation of the etching apparatus.

FIG. 3 is a graph showing an example of changes of a set value (line A) and an actual value (line B) of the boiling level and a set value (corrected set value) (line C) and an actual value (line D) of the concentration with a lapse of time when performing a test operation of the etching apparatus based on the above-described control method. A left-side vertical axis indicates the output voltage of the sensor of the second detector 86B, and the median value (which is a target value) of the output voltage when the optimum boiling state is achieved is 4 V. A right-side vertical axis indicates the concentration of the phosphoric acid in the phosphoric acid aqueous solution. A horizontal axis indicates an elapsed time (sec). The target value (set concentration) of the phosphoric acid concentration is corrected at the pitch of 0.02 wt %. As can be seen from FIG. 3, a stable boiling state is obtained between 500 sec to 5500 sec. Further, though not shown in FIG. 3, the temperature of the phosphoric acid aqueous solution is maintained within a range of 160° C.±0.1° C.~0.2° C. between 500 sec and 5500 sec.

In addition to the above-stated three feedback-controls, a control of a silicon concentration in the phosphoric acid aqueous solution may also be performed while the wet etching processing is being performed on the substrates 8. During the processing of the substrates 8 corresponding to the single lot, since silicon is eluted from the substrates 8, the silicon concentration in the phosphoric acid aqueous solution which exists in the circulation system is increased. During the processing of the substrates 8 of the single lot, in order to maintain or intentionally change the silicon concentration in the phosphoric acid aqueous solution existing in the circulation system, the phosphoric acid aqueous solution (new liquid) can be supplied by the phosphoric acid aqueous solution supply unit 40 while draining the phosphoric acid aqueous solution within the circulation system by the phosphoric acid aqueous solution drain unit 43. A silicon solution may be supplied from the silicon supply unit 42. Here, however, since it is difficult to feedback-control the silicon concentration in real time, it may be desirable to implement the control of the silicon concentration by performing a discharge and a supply of the liquid at preset timings set in the process recipes.

If the processing of the substrates 8 corresponding to the single lot is completed as stated above, the cover 70 is opened, and the substrates 8 are carried out of the inner tub 34A. These substrates 8 are then carried into the adjacent processing tub 35 and a rinsing processing is performed therein.

Thereafter, the cover 70 is closed, and after the phosphoric acid concentration, the silicon concentration and the temperature of the phosphoric acid aqueous solution within the circulation system are adjusted, a processing of substrates 8 corresponding to another lot is performed in the same way as described above.

In the above-described exemplary embodiment, the control unit 7 have the control functions over the concentration control unit, the temperature control unit and the concentration set value correction unit. However, without being limited thereto, at least one of the control functions of the concentration control unit, the temperature control unit and the concentration set value correction unit may be implemented by another computer.

According to the above-described exemplary embodiment, the boiling state (boiling level) of the phosphoric acid aqueous solution within the inner tub 34A is estimated based on the detection value of the second detectors 86B which is the head pressure sensor; the set concentration is corrected to maintain the boiling state in the target state; and the feedback control of the concentration is performed based on this corrected set concentration. Thus, the boiling level of the phosphoric acid aqueous solution within the inner tub 34A can be easily maintained in the optimum state. Further, by controlling the boiling level through the concentration correction, the concentration which has an effect on a process performance can also be managed at the same time.

Now, a method of investigating soundness of the boiling level sensor (bubbling type liquid level meter 80) will be explained.

The temperature of the phosphoric acid aqueous solution, the concentration of the phosphoric acid aqueous solution and the boiling level of the phosphoric acid aqueous solution have a strong correlation. Accordingly, if the detection value of the temperature sensor (e.g., the temperature sensor 60) detecting the temperature of the phosphoric acid aqueous solution is not stabilized at the set temperature (specifically, a temperature within a tolerance range with respect to the set temperature), there may be a possibility that the boiling level sensor might have an abnormality.

Further, if the detection concentration of the phosphoric acid concentration meter 55B is not stabilized at the set concentration (specifically, a concentration within a tolerance range with respect to the set concentration), the boiling level sensor might be abnormal.

Furthermore, if the supply amount of the pure water from the pure water supply unit 41 is excessively large or excessively small, there may be a possibility that the boiling level sensor is abnormal. That is, if processing conditions, specifically, the temperature and the boiling level of the phosphoric acid aqueous solution in the circulation system are appropriately controlled, the amount of water lost by the evaporation, which is caused by the boiling, per unit time may be maintained constant, and, accordingly, the amount of the pure water supplemented into the circulation system from the pure water supply unit 41 may be included in a preset range (further, the pure water may be supplemented into the circulation system from the pure water supply unit 41 continuously or intermittently). Therefore, if the supply amount of the pure water from the pure water supply unit 41 per unit time exceeds the preset range, this implies that there might be an abnormality in the boiling level sensor.

If one of the abnormality of the detection value of the temperature sensor, the abnormality of the detection value of the phosphoric acid concentration meter 55B or the abnormality of the supply amount of the pure water from the pure water supply unit 41 is acknowledged or this abnormality is continued more than a preset time period, the control unit 7 generates an alarm that informs an operator of the substrate processing apparatus of a possibility that there may be an abnormality in the boiling level sensor (bubbling type liquid level meter 80) and urges the operator to inspect the boiling level sensor. Further, the control unit 7 may set forth an alarm informing the operator of a possibility that there may be a processing error on the substrates 8 of the lot being processed at that moment.

Figure 4:
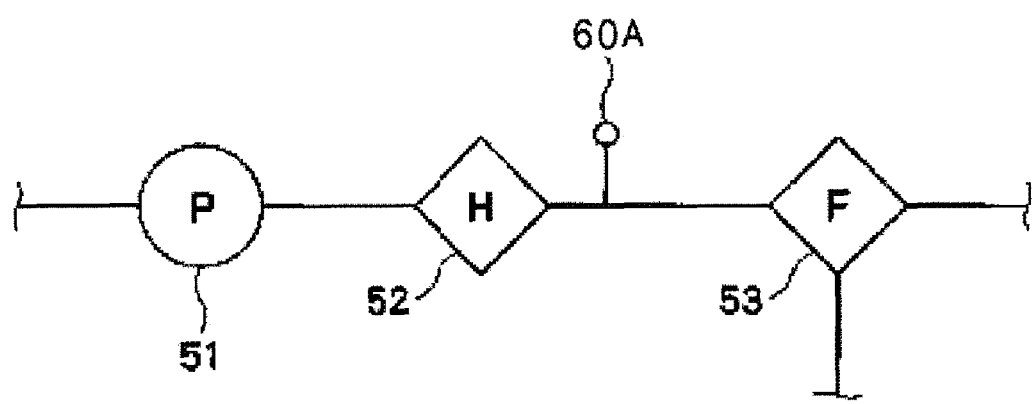
FIG. 4 is a schematic diagram illustrating a modification example of the exemplary embodiment in which the temperature sensor is provided at an outlet of a heater provided on a circulation line.

Moreover, as depicted in FIG. 4, a temperature sensor 60A may be provided at an outlet of the heater 52, and the output of the heater 52 (a power supplied to the heater 52) may be controlled based on a detection value of the temperature sensor 60A. In this case, if the detection value of the temperature sensor 60A is not stabilized at the set temperature (specifically, a temperature within the tolerance range with respect to the set temperature), it may be determined that the boiling level sensor might be abnormal.

Furthermore, it may be desirable that the soundness of the boiling level sensor (bubbling type liquid level meter 80) is investigated when the heater temperature is relatively stabilized, specifically, when the processing of the substrates 8 is not performed in the processing tub 34, for example.

In the above-described exemplary embodiments, though the phosphoric acid aqueous solution is used as the processing liquid, the exemplary embodiments are not limited thereto and various kinds of processing liquids, in which the concentration is changed by boiling and a processing state of the substrate is changed depending on the boiling state, may be employed. Further, the substrate is not limited to the semiconductor wafer, and any of various types of substrates such as a glass substrate and a ceramic substrate may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
   a processing tub which is configured to store therein a processing liquid in a boiling state and in which a processing of a substrate is performed by immersing the substrate in the stored processing liquid;
   a concentration sensor configured to detect a concentration of a chemical liquid component contained in the processing liquid;
   a concentration control unit configured to control the concentration of the chemical liquid component contained in the processing liquid to a set concentration by adding the chemical liquid component or a diluting solution to the processing liquid based on a detection concentration of the concentration sensor;

a first head pressure sensor configured to detect a head pressure of the processing liquid within the processing tub;

a second head pressure sensor configured to detect a head pressure of the processing liquid within the processing tub at a time when the processing liquid is overflowing from the processing tub; and a concentration set value correction unit configured to correct, based on a detection value of the second head pressure sensor, the set concentration assigned to the concentration control unit, and wherein the second head pressure sensor is set to detect the head pressure within a target range narrower than a detection range of the first head pressure sensor, and a detection resolution of the second head pressure sensor within the target range is higher than a detection resolution of the first head pressure sensor, wherein the target range is a range from the head pressure when a boiling level of the processing liquid is maximum to the head pressure when the processing liquid is not boiled at all, and the second head pressure sensor is configured to be insensitive to a pressure out of the target range.

2. The substrate liquid processing apparatus of claim 1, further comprising:

a temperature sensor configured to detect a temperature of the processing liquid; and a temperature control unit configured to control the temperature of the processing liquid to reach a set temperature by adjusting an output of a heater based on a detection temperature of the temperature sensor.

3. The substrate liquid processing apparatus of claim 2, further comprising:

a circulation line connected to the processing tub; and a pump provided at the circulation line and configured to generate a flow of the processing liquid flowing out from the processing tub and returning back to the processing tub after passing through the circulation line, wherein the temperature sensor is provided at a preset position within a circulation system including the processing tub and the circulation line, and the heater is provided at the circulation line.

4. The substrate liquid processing apparatus of claim 3, wherein the concentration sensor is provided at the circulation line.

5. The substrate liquid processing apparatus of claim 3, further comprising:

a control unit configured to generate an alarm informing a possibility that the second head pressure sensor has an abnormality, when the temperature of the processing liquid detected by the temperature sensor is not stabilized at the set temperature.

6. The substrate liquid processing apparatus of claim 5, wherein the temperature sensor is provided at an outlet of the heater of the circulation line.

7. The substrate liquid processing apparatus of claim 2, further comprising:

a control unit configured to generate an alarm informing a possibility that the second head pressure sensor has an abnormality, when the temperature of the processing liquid detected by the temperature sensor is not stabilized at the set temperature.

8. The substrate liquid processing apparatus of claim 1, wherein the processing tub comprises:

an inner tub configured to store therein the processing liquid and in which the processing of the substrate is performed by immersing the substrate in the stored processing liquid; and an outer tub configured to receive the processing liquid overflowing from the inner tub.

9. The substrate liquid processing apparatus of claim 8, wherein the concentration control unit is configured to add the chemical liquid component or the diluting solution to the processing liquid within the outer tub.

10. The substrate liquid processing apparatus of claim 1, further comprising:

a control unit configured to generate an alarm informing a possibility that the second head pressure sensor has an abnormality, when the concentration of the chemical liquid component detected by the concentration sensor is not stabilized at the set concentration.

11. The substrate liquid processing apparatus of claim 1, further comprising:

a control unit configured to generate an alarm informing a possibility that the second head pressure sensor has an abnormality, when an amount of the diluting solution added to the processing liquid by the concentration control unit per unit time is not an amount corresponding to a processing condition.

12. The substrate liquid processing apparatus of claim 1, wherein the processing liquid is a phosphoric acid aqueous solution, the chemical liquid component is phosphoric acid, and the diluting solution is pure water.

* * * * *